(12) United States Patent
Maki

(10) Patent No.: US 10,523,226 B2
(45) Date of Patent: Dec. 31, 2019

(54) QUANTUM INTERFERENCE DEVICE, ATOMIC OSCILLATOR, ELECTRONIC APPARATUS, AND VEHICLE

(71) Applicant: SEIKO EPSON CORPORATION, Tokyo (JP)

(72) Inventor: Yoshiyuki Maki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 159 days.

(21) Appl. No.: 15/460,968

(22) Filed: Mar. 16, 2017

(65) Prior Publication Data

US 2017/0279455 A1  Sep. 28, 2017

(30) Foreign Application Priority Data

Mar. 25, 2016  (JP) ................. 2016-061382

(51) Int. Cl.
*H03B 17/00* (2006.01)
*H03L 1/02* (2006.01)
*H03L 7/26* (2006.01)

(52) U.S. Cl.
CPC ............... *H03L 7/26* (2013.01); *H03B 17/00* (2013.01); *H03L 1/02* (2013.01)

(58) Field of Classification Search
CPC ........... G04F 5/14; G04F 5/145; H03B 17/00; H03L 1/02; H03L 7/26
USPC ....................... 331/3, 68–70, 94.1
See application file for complete search history.

(56) References Cited

U.S. PATENT DOCUMENTS

| | | | | |
|---|---|---|---|---|
| 3,382,452 A * | 5/1968 | Rempel | ...................... | H03L 7/26 331/3 |
| 4,405,905 A * | 9/1983 | Busca | ........................ | H03L 7/26 331/3 |
| 4,494,085 A * | 1/1985 | Goldberg | ............. | G01N 24/006 324/304 |
| 5,670,914 A * | 9/1997 | Liberman | ................. | G04F 5/14 250/251 |
| 6,265,945 B1 * | 7/2001 | Delaney | .................. | G04F 5/145 331/3 |
| 6,900,702 B2 * | 5/2005 | Youngner | ................. | G04F 5/14 331/94.1 |
| 7,215,213 B2 | 5/2007 | Mescher et al. | | |
| 8,067,990 B2 * | 11/2011 | Chindo | ................... | G04F 5/145 250/251 |
| 8,242,851 B2 * | 8/2012 | Youngner | ............... | G04F 5/145 331/3 |

(Continued)

FOREIGN PATENT DOCUMENTS

JP  4972550 B2  7/2012
JP  2013-143497 A  7/2013

(Continued)

*Primary Examiner* — Levi Gannon
(74) *Attorney, Agent, or Firm* — Oliff PLC

(57) ABSTRACT

A quantum interference device includes a base having a mounting surface, an atom cell in which alkali metal atoms are encapsulated, a light source adapted to emit light adapted to excite the alkali metal atoms, a photodetector adapted to detect the light having been transmitted through the atom cell, and a support adapted to support the atom cell, the light source, and the photodetector in a lump with respect to the mounting surface in a state in which the atom cell, the light source, and the photodetector are arranged in a direction along the mounting surface.

19 Claims, 9 Drawing Sheets

(56) References Cited

U.S. PATENT DOCUMENTS

| | | | |
|---|---|---|---|
| 8,878,617 B2 | 11/2014 | Nishida | |
| 9,164,491 B2 * | 10/2015 | Ridley | G04F 5/145 |
| 9,293,422 B1 * | 3/2016 | Parsa | H01L 31/109 |
| 9,294,109 B2 | 3/2016 | Nishida | |
| 9,350,369 B2 | 5/2016 | Tanaka | |
| 9,356,426 B2 | 5/2016 | Chindo | |
| 2009/0066430 A1 * | 3/2009 | Braun | G04F 5/14 |
| | | | 331/94.1 |
| 2013/0015920 A1 * | 1/2013 | Sato | G04F 5/14 |
| | | | 331/94.1 |
| 2014/0232479 A1 * | 8/2014 | Maki | H01S 1/06 |
| | | | 331/94.1 |

FOREIGN PATENT DOCUMENTS

| | | |
|---|---|---|
| JP | 2014-192705 A | 10/2014 |
| JP | 2015-122598 A | 7/2015 |
| WO | 2006-017345 A2 | 2/2006 |

* cited by examiner

QUANTUM INTERFERENCE DEVICE, ATOMIC OSCILLATOR, ELECTRONIC APPARATUS, AND VEHICLE

CROSS-REFERENCE TO RELATED APPLICATIONS

This application claims priority to Japanese Patent Application No. 2016-061382, filed Mar. 25, 2016, the entirety of which is hereby incorporated by reference.

BACKGROUND

1. Technical Field

Various embodiments of the present invention relate to a quantum interference device, an atomic oscillator, an electronic apparatus, and a vehicle.

2. Related Art

As an oscillator having an accurate oscillation characteristic for a long period of time, there has been known an atomic oscillator, which oscillates based on the energy transition of an atom of alkali metal such as rubidium or cesium (see, e.g., Japanese Patent No. 4,972,550). Further, the atomic oscillator using the quantum interference effect can be miniaturized more easily than the atomic oscillator using the double resonance phenomenon, and is therefore expected to be mounted on a variety of types of apparatuses in recent years.

For example, the atomic oscillator described in Document 1 is provided with a chip-scale device having a light source, a photodetector device, and a steam cell (an atom cell) integrated with each other, and a suspension device for suspending the chip-scale device. By integrating the light source, the photodetector device, and the steam cell with each other, it is possible to achieve the miniaturization of the atomic oscillator.

In the atomic oscillator, in order to obtain a good oscillation characteristic, in general, a certain distance becomes necessary between the light source and the atom cell. In the atomic oscillator described in Japanese Patent No. 4,972,550, the light source, the photodetector device, and the steam cell are arranged in the height direction. Therefore, in the atomic clock system of Japanese Patent No. 4,972,550, there is a problem that it is difficult to achieve height reduction.

SUMMARY

An advantage of some aspects of the invention is to provide a quantum interference device capable of achieving the height reduction while making the characteristic excellent, and further provide an atomic oscillator, an electronic apparatus, and a vehicle each equipped with the quantum interference device.

The advantage can be achieved by the following configurations.

A quantum interference device according to an aspect of the invention includes a base having a mounting surface, an atom cell in which alkali metal atoms are encapsulated, a light source adapted to emit light adapted to excite the alkali metal atoms, a photodetector adapted to detect the light having been transmitted through the atom cell, and a support adapted to support the atom cell, the light source, and the photodetector in a lump with respect to the mounting surface in a state in which the atom cell, the light source, and the photodetector are arranged in a direction along the mounting surface.

According to such a quantum interference device, since the support supports the atom cell, the light source, and the photodetector in a lump (integrally) with respect to the mounting surface, the atom cell, the light source, and the photodetector can be housed in a lump in a single small-sized container. Moreover, since the atom cell, the light source, and the photodetector supported by the support are arranged in the direction along the mounting surface, even if the necessary distance between the atom cell and the light source is sufficiently ensured, the height reduction of the quantum interference device can be achieved. Therefore, it is possible to provide the quantum interference device small in size and capable of achieving the height reduction while making the characteristics (e.g., oscillation characteristics, the same applies to the following) excellent.

In the quantum interference device according to the aspect of the invention, it is preferable that the quantum interference device further includes a connector adapted to fix a relative positional relationship between the atom cell, the light source, and the photodetector, and the support is formed using a material lower in thermal conductivity than the connector.

With this configuration, it is possible to reduce the deterioration of the oscillation characteristic due to the displacement of the relative positional relationship between the atom cell, the light source, and the photodetector. Further, the thermal conduction between the atom cell, the light source, and the photodetector, and the base via the support can be reduced. Further, due to the high thermal conductivity of the connector, the temperature distribution in a unit including the atom cell and the light source can be homogenized irrespective of the number and the arrangement of the heaters for heating the atom cell and the light source.

In the quantum interference device according to the aspect of the invention, it is preferable that the connector is formed using a metal material.

With this configuration, the mechanical strength and the thermal conductivity of the connector can be made excellent.

In the quantum interference device according to the aspect of the invention, it is preferable that the support is formed using a resin material.

With this configuration, it is possible to increase the thermal resistance of the support while ensuring the necessary mechanical strength of the support.

In the quantum interference device according to the aspect of the invention, it is preferable that the quantum interference device further includes a heater supported by the support together with the atom cell, the light source, and the photodetector, and adapted to heat the light source, and a distance between the heater and the light source is shorter than a distance between the heater and the atom cell.

With this configuration, the temperature control of the light source can be performed with high accuracy. Therefore, the wavelength variation of the light from the light source due to the temperature variation of the light source can be reduced.

In the quantum interference device according to the aspect of the invention, it is preferable that a distance between an end of the atom cell located on an opposite side to the mounting surface and the mounting surface is shorter than a distance between the light source and the photodetector.

With this configuration, the height reduction of the quantum interference device can be achieved compared to the case in which the atom cell, the light source, and the photodetector are arranged along a direction perpendicular to the mounting surface.

In the quantum interference device according to the aspect of the invention, it is preferable that when viewed along a direction in which the atom cell and the light source are arranged, a length of the atom cell in a direction along the mounting surface is longer than a length of the atom cell in a direction perpendicular to the mounting surface.

With this configuration, the height reduction of the atom cell can be achieved while ensuring the necessary irradiation area of the light from the light source to the atom cell.

In the quantum interference device according to the aspect of the invention, it is preferable that the quantum interference device further includes a container having an internal space, which houses the atom cell, the light source, the photodetector, and the support, and is reduced in pressure from an atmospheric pressure, and the base constitutes a part of the container.

With this configuration, it is possible to reduce the thermal conduction between the unit including the atom cell and the light source, and the container. Therefore, it is possible to make the oscillation characteristics of the quantum interference device excellent, and to achieve the reduction in power consumption of the quantum interference device.

An atomic oscillator according to another aspect of the invention includes the quantum interference device according to any one of the aspects of the invention.

With this configuration, it is possible to provide the atomic oscillator small in size and capable of achieving the height reduction while making the characteristics excellent.

An electronic apparatus according to another aspect of the invention includes the quantum interference device according to any one of the aspects of the invention.

With this configuration, it is possible to provide the electronic apparatus equipped with the quantum interference device small in size and capable of achieving the height reduction while making the characteristics excellent.

A vehicle according to another aspect of the invention includes the quantum interference device according to any one of the aspects of the invention.

With this configuration, it is possible to provide the vehicle equipped with the quantum interference device small in size and capable of achieving the height reduction while making the characteristics excellent.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a vehicle according to the invention will be described in detail based on some preferred embodiments shown in the accompanying drawings.

1. Atomic Oscillator

Firstly, the atomic oscillator (atomic oscillator equipped with the quantum interference device) according to the invention will be described. It should be noted that although an example of applying the quantum interference device according to the invention to the atomic oscillator will hereinafter be described, the quantum interference device according to the invention can be applied not only to the atomic oscillator, but also to, for example, a magnetic sensor and a quantum memory.

First Embodiment

Figure 1:
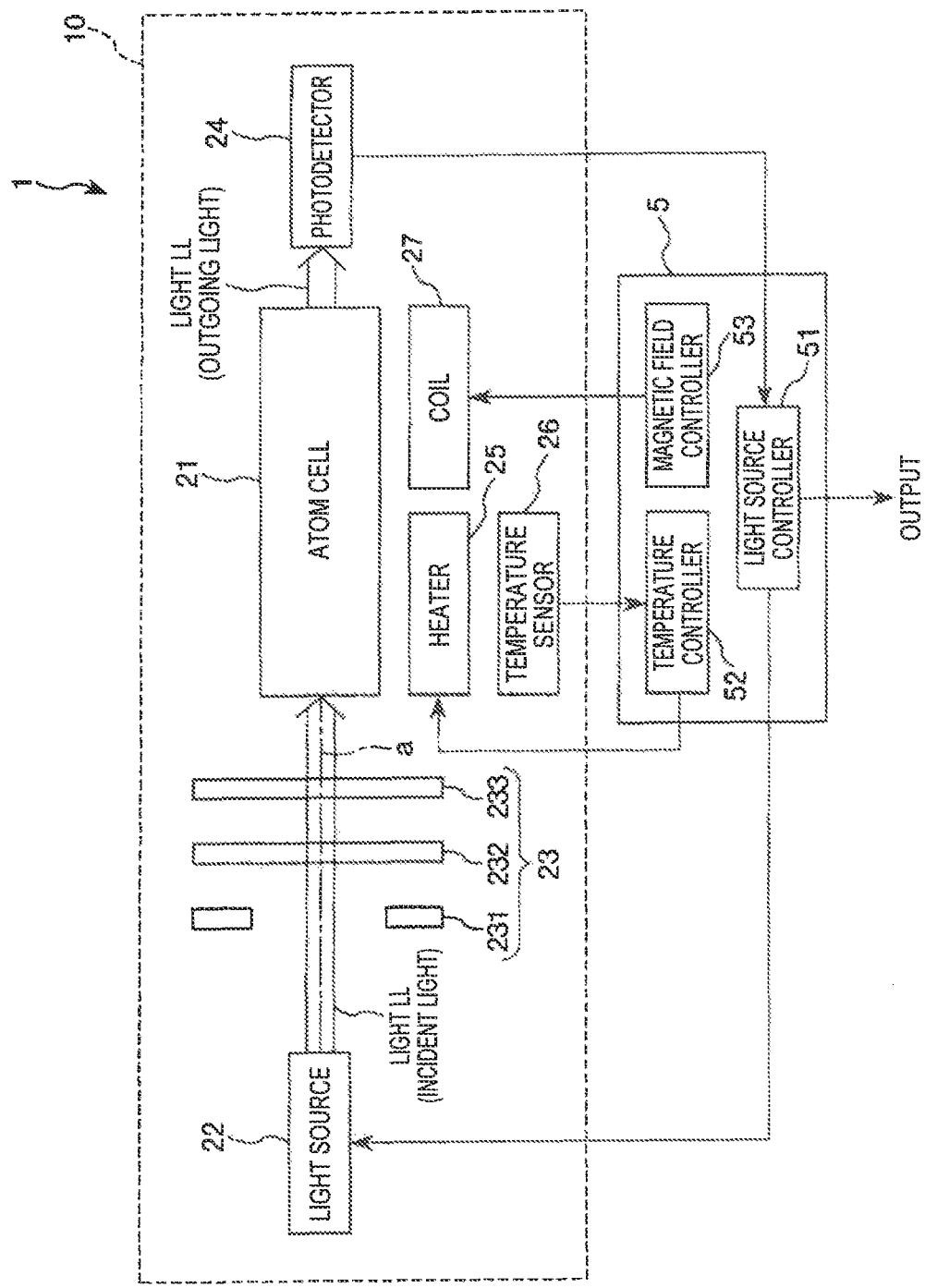
FIG. 1 is a cross-sectional view showing an atomic oscillator according to first embodiment.

FIG. 1 is a cross-sectional view showing the atomic oscillator according to a first embodiment of the invention.

The atomic oscillator 1 shown in FIG. 1 is an atomic oscillator using the quantum interference effect (coherent population trapping (CPT)) with which there occurs a phenomenon that when irradiating an alkali metal atom with two resonance light beams having specific wavelengths different from each other at the same time, the two resonance light beams are transmitted through the alkali metal without being absorbed by the alkali metal. It should be noted that the phenomenon due to the quantum interference effect is also referred to as electromagnetically induced transparence (EIT) phenomenon.

As shown in FIG. 1, the atomic oscillator 1 has a package 10 for causing the quantum interference effect, and a controller 5 for controlling the package 10. Here, the package 10 has an atom cell 21, a light source 22, an optical system 23, a photodetector 24, a heater 25, a temperature sensor 26, and a coil 27. Further, the controller 5 has a light source controller 51, a temperature controller 52, and a magnetic field controller 53. Firstly, an outline of the atomic oscillator 1 will hereinafter be described.

In the atomic oscillator 1, the light source 22 irradiates the atom cell 21 with the light LL along the optical axis a via the optical system 23, and the photodetector 24 detects the light LL having been transmitted through the atom cell 21.

The atom cell 21 has a light transmissive property, and alkali metal (metal atom) is encapsulated in the atom cell 21. The alkali metal has energy levels of three-level system comprising two ground levels different from each other, and an excited level. Further, the alkali metal in the atom cell 21 is heated by the heater 25, and becomes in a gas state. Further, a magnetic field in a desired direction is applied from the coil 27 to the alkali metal in the atom cell 21, and thus, the alkali metal in the atom cell 21 is in the Zeeman splitting state.

The light LL emitted from the light source 22 includes two types of light different in frequency from each other. These two types of light cause the EIT phenomenon when the two types of light become a pair of resonance light beams having the frequency difference coinciding the frequency corresponding to the difference in energy between the two ground levels of the alkali metal in the atom cell 21.

The light source controller 51 controls the frequencies of the two types of light included in the light L emitted from the light source 22 described above based on the detection result of the photodetector 24 so as to cause the EIT phenomenon. Further, the light source controller 51 is provided with a voltage-controlled crystal oscillator (not shown), the oscillation frequency of which is controlled in accordance with the detection result of the photodetector 24. Further, the output signal of the voltage-controlled crystal oscillator (VCXO) is output as a clock signal of the atomic oscillator 1.

Further, the temperature controller 52 controls the energization to the heater 25 based on the detection result of the temperature sensor 26 for detecting the temperature of the atom cell 21 so that the atom cell 21 becomes at a desired temperature. Further, the magnetic field controller 53 controls the energization to the coil 27 so that the magnetic field generated by the coil 27 becomes constant.

Such a controller 5 is disposed in, for example, an IC chip mounted on a board on which the package 10 is mounted. It should be noted that it is also possible for the controller 5 to be provided to the package 10.

Hereinabove, the schematic configuration of the atomic oscillator 1 is described. In such an atomic oscillator 1, in order to obtain a good oscillation characteristic, it is necessary to increase the width of the light LL in the atom cell 21 to some extent. However, since the radiation angle of the light LL emitted from the light source 22 is relatively narrow, it is necessary to ensure a certain distance between the light source 22 and the atom cell 21. Incidentally, in recent years, there has been demanded further miniaturization (in particular height reduction) of the atomic oscillator using the quantum interference effect. Therefore, in order to deal with such a demand, the package 10 provided to the atomic oscillator 1 has a configuration in which the arrangement of the light source 22, the atom cell 21, and so on is considered. Hereinafter, the package 10 will be described in detail.

Figure 2:
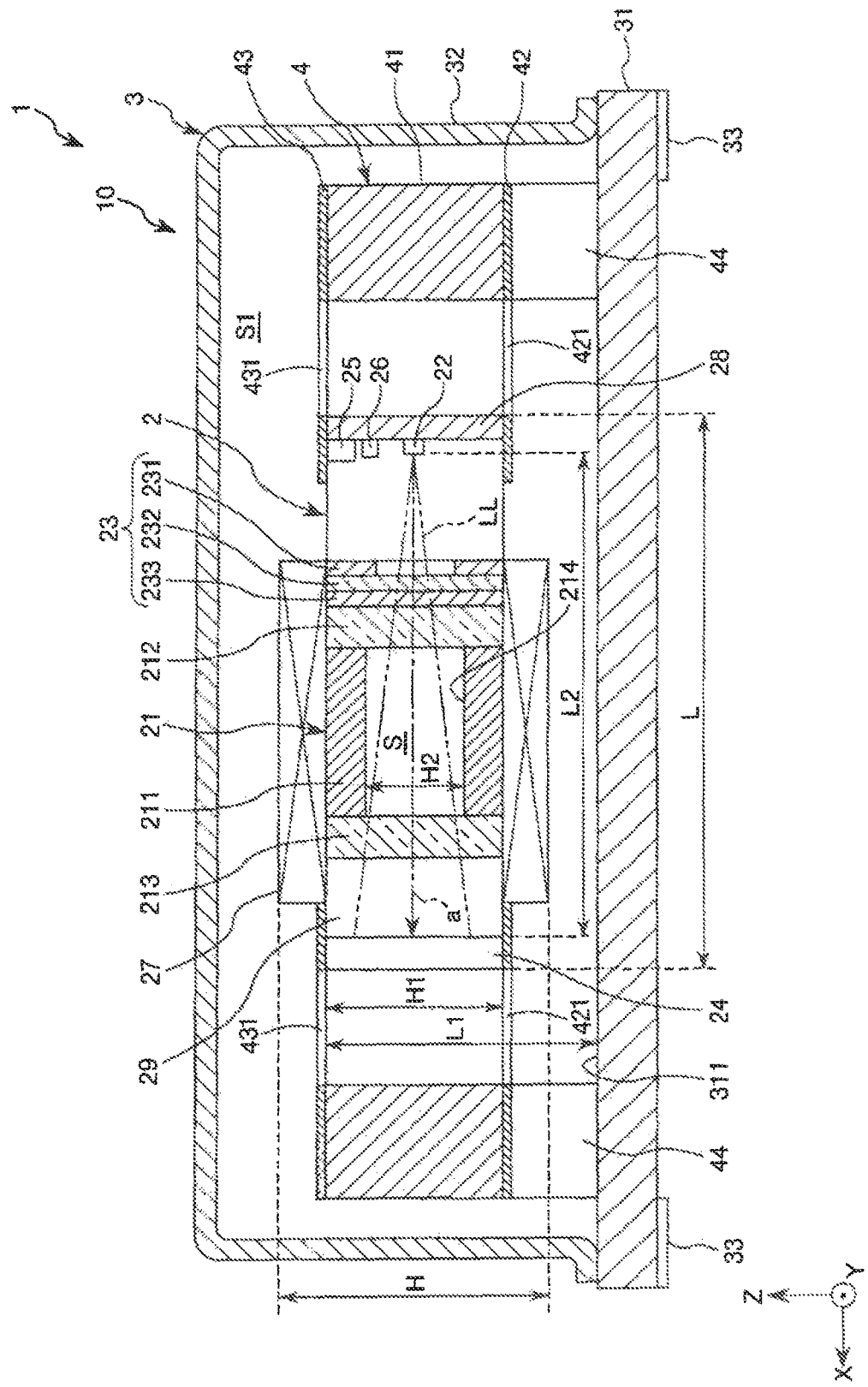
FIG. 2 is a cross-sectional view showing a schematic configuration of a package provided to the atomic oscillator shown in FIG. 1.
Figure 3:
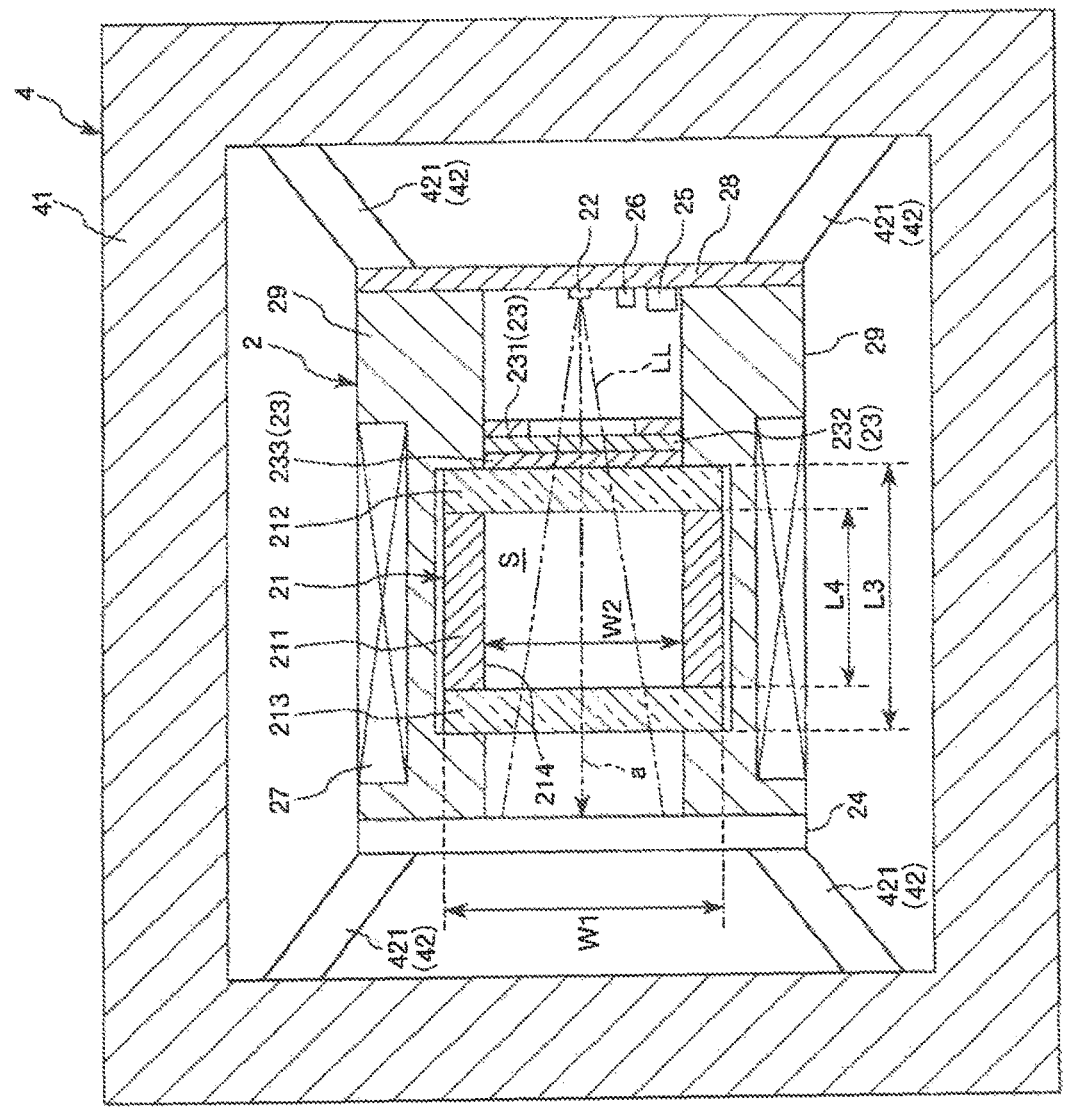
FIG. 3 is a plan view showing an internal configuration of the package shown in FIG. 2.
Figure 3:
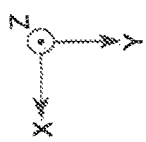
Figure 4:
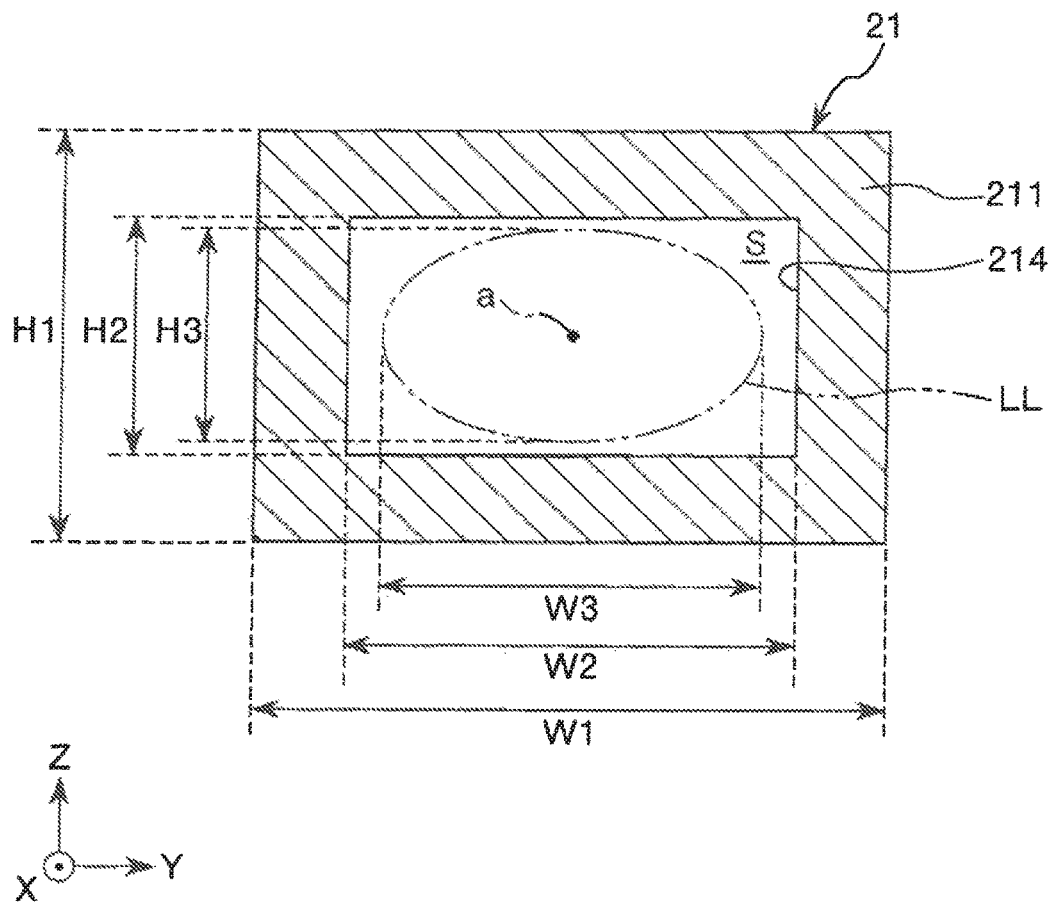
FIG. 4 is a cross-sectional view of an atom cell, which is provided to the package shown in FIG. 2, viewed from the light source side.

FIG. 2 is a cross-sectional view showing a schematic configuration of the package provided to the atomic oscillator shown in FIG. 1. FIG. 3 is a plan view showing an internal configuration of the package shown in FIG. 2. FIG. 4 is a cross-sectional view of the atom cell, which is provided to the package shown in FIG. 2, viewed from the light source side. It should be noted that, in each of the drawings, an X axis, a Y axis, and a Z axis perpendicular to each other are illustrated by arrows, and the tip side of each of the arrows is defined as "+," and the base end side is defined as "−" for the sake of convenience of explanation. Further, a direction parallel to the X axis is referred to as an "X-axis direction," a direction parallel to the Y axis is referred to as a "Y-axis direction," and a direction parallel to the Z axis is referred to as a "Z-axis direction." Further, the upper side (+Z-axis direction side) in FIG. 2 is referred to as an "upper side," and the lower side (−Z-axis direction side) is referred to as a "lower side."

As shown in FIG. 2, the package 10 provided to the atomic oscillator 1 is provided with an atom cell unit 2 for causing such a quantum interference effect as described above, the container 3 for housing the atom cell unit 2, and a support 4 for supporting the atom cell unit 2 with respect to the container 3. It should be noted that it is also possible for a magnetic shield to be disposed on the outer side of the container 3 as needed. Hereinafter, each of the parts of the package 10 will sequentially be described.

Atom Cell Unit

The atom cell unit 2 includes the atom cell 21, the light source 22, the optical system 23, the photodetector 24, the heater 25, the temperature sensor 26, a substrate 28, a pair of connectors 29, and the coil 27, and these constituents are unitized. Specifically, on one of the surfaces of the substrate 28, there are mounted the light source 22, the heater 25, the temperature sensor 26, and the pair of connectors 29, the atom cell 21 and the optical system 23 are held by the pair of connectors 29, and the photodetector 24 is bonded to the pair of connectors 29.

Atom Cell

As shown in FIG. 2 and FIG. 3, the atom cell 21 has a body 211 provided with a through hole 214 having a cylindrical shape, and a pair of light transmissive parts 212, 213 for blocking the both sides of the through hole 214. Thus, there is formed an internal space S in which the gaseous alkali metal such as rubidium, cesium, or sodium is encapsulated. It should be noted that, in the internal space S, as a buffer gas, a noble gas such as argon or neon, or an inert gas such as nitrogen can also be encapsulated together with the alkali metal gas if needed.

Each of the light transmissive parts 212, 213 has permeability with respect to the light LL from the light source 22. Then, through the one light transmissive part 212, there is transmitted the light LL entering the internal space S, and through the other light transmissive part 213, there is transmitted the light LL emitted from the internal space S. The constituent material of the light transmissive parts 212, 213 is not particularly limited, but a glass material and a quartz crystal, for example, can be cited.

Further, the constituent material of the body 211 of the atom cell 21 is not particularly limited, but a silicon material, a ceramics material, a metal material, a resin material, a glass material, a quartz crystal, and so on can be cited.

Further, each of the light transmissive parts 212, 213 are airtightly bonded to the body 211. Thus, the internal space S of the atom cell 21 can be made to be an airtight space. The bonding method of the body 211 of the atom cell 21 and the light transmissive parts 212, 213 is determined in accordance with the constituent materials of these parts, and is not particularly limited, but there can be used, for example, a bonding method with an adhesive, a direct bonding method, and an anodic bonding method.

As shown in FIG. 4, the width W1 of such an atom cell 21, which is a length of the atom cell 21 along the Y-axis direction, is larger than the height H1, which is a length along the Z-axis direction when viewed in the X-axis direction, which is a direction along the optical axis a, namely when viewed along a direction in which the atom cell 21 and the light source 22 are arranged. Further, the width W2 of the internal space S, which is a length of the internal space S along the Y-axis direction, is also larger than a height H2, which is a length along the Z-axis direction, viewed from the X-axis direction. Here, the ratio W2/H2 between the width W2 and the height H2 is, for example, no lower than 1.1 and no higher than 2.0. The width W2 is in roughly the same level as or larger than the length L4 of the internal space S along the X-axis direction, and is, for example, no smaller than 2 mm and no larger than 10 mm. Further, the width W1 is in roughly the same level as the length L3 of the atom cell 21 along the X-axis direction.

It should be noted that the shape of the lateral surface (the cross-sectional surface in a direction perpendicular to the optical axis a) of the lateral cross-sectional surface of the through hole 214, namely the shape of the lateral cross-sectional surface of the internal space S, is not particularly limited, but there can be cited, for example, a circular shape, an elliptical shape, and a polygonal shape such as a rectangular shape.

Light Source

The light source 22 has a function of emitting the light LL capable of exciting the alkali metal atoms in the atom cell 21. The light source 22 is not particularly limited as long as the light LL including such resonance light pair as described above can be emitted, and it is preferable to use a light emitting element such as a semiconductor laser such as a vertical cavity surface emitting laser (VCSEL).

It is preferable for the shape (the beam profile) of the cross-section perpendicular to the optical axis a of the light LL from the light source 22 to be an elliptical shape or an oval shape as shown in FIG. 4. Thus, it is possible to efficiently irradiate the alkali metal in the internal space S of the atom cell 21 with the light LL throughout a broad range. Here, the width W3 of the light LL, which is a length of the light LL along the Y-axis direction, is larger than the height H3, which is a height along the Z-axis direction, when viewed from the X-axis direction, which is a direction along the optical axis a, in the internal space S. Further, the width W3 is slightly smaller than the width W2 described above, and the height H3 is slightly smaller than the height H2 described above. It should be noted that even if the light source 22 itself does not emit the light LL having such a cross-sectional shape as described above, it is also possible to realize such a cross-sectional shape of the light LL as described above by a light-blocking 231 described later.

Optical System

The optical system 23 is disposed between the light source 22 and the atom cell 21, and is provided with the light-blocking member 231 and optical components 232, 233. In the present embodiment, the light-blocking member 231, the optical component 232, and the optical component 233 are disposed in this order along the optical axis a from the light source 22 side toward the atom cell 21.

The light-blocking member 231 is a film-like member having a light-blocking property, and is disposed on one surface of the optical component 232. The constituent material of the light-blocking member 231 is not particularly limited providing the material has a light-blocking property, and, for example, a resin material, and a metal material can be used therefor. Further, it is preferable for the light-blocking member 231 to be provided with an antireflection property from a viewpoint of preventing the light LL having entered the light-blocking member 231 from becoming stray light. Further, the light-blocking member 231 can be formed by performing a known deposition method on the optical component 232.

The light-blocking member 231 has an opening for partially transmitting the light LL, and the part except the opening has a light-blocking property. The shape of the opening is determined in accordance with the lateral cross-sectional shape of the internal space S described above, and is not particularly limited, but has, for example, a circular shape or a rectangular shape. In the present embodiment, since the width of the lateral cross-sectional shape of the internal space S is larger than the height as described above, it is preferable for the opening of the light-blocking member 231 to have the width larger than the height in accordance with the lateral cross-sectional shape of the internal space S. By transmitting the light LL through such an opening of the light-blocking member 231, it is possible to adjust the shape of the light LL entering the internal space S, and at the same time achieve homogenization of the intensity distribution in the width direction of the light LL.

The optical component 232 is a neutral density filter (ND filter). Thus, it is possible to adjust (decrease) the intensity of the light LL entering the atom cell 21. Therefore, even in the case in which the output of the light source 22 is high, it is possible to set the intensity of the light LL entering the atom cell 21 to a desired intensity.

The optical component 233 is a 1/4 wave plate. Thus, it is possible to convert the light LL from the light source 22 from linearly polarized light to circularly polarized light (right circularly polarized light or left circularly polarized light). By using the light LL circularly polarized, it is possible to increase the number of atoms developing the desired EIT phenomenon to increase the intensity of the desired EIT signal. As a result, the oscillation characteristics of the atomic oscillator 1 can be improved.

It should be noted that the optical system 23 can also be provided with other optical components such as a lens or a polarization plate besides the light-blocking member 231 and the optical components 232, 233. Further, depending on the intensity of the light LL from the light source 22, the optical component 232 can be eliminated. Further, the arrangement order of the light-blocking member 231, and the optical components 232, 233 is not limited to the order described above, but is arbitrary.

Photodetector

The photodetector 24 has a function of detecting the intensity of the light LL (more specifically, the resonance light pair) having been transmitted through the atom cell 21. The photodetector 24 is bonded to the pair of connectors 29 with an adhesive or the like. The photodetector 24 is not particularly limited providing such light LL as described above can be detected, and for example, a light detecting device (a light sensitive element) such as a solar cell or a photodiode can be used as the photodetector 24.

Heater

The heater 25 has a heating resistive element (heating part) for generating heat due to energization. The heater 25 is disposed on the substrate 28 as described above. Further, the heat from the heater 25 is transmitted to the atom cell 21 via the substrate 28 and the pair of connectors 29. Thus, the atom cell 21 (more specifically, the alkali metal in the atom cell 21) is heated. Further, in the present embodiment, the heat from the heater 25 is also transmitted to the light source 22 via the substrate 28.

Further, the heater 25 is separated from the atom cell 21. Thus, an unwanted magnetic field generated by the energization of the heater 25 can be prevented from making a harmful influence to the metal atom in the atom cell 21.

Temperature Sensor

The temperature sensor 26 has a function of detecting the temperature of the light source 22, the heater 25, or the atom cell 21. The temperature sensor 26 is not particularly limited, and a variety of known temperature sensors such as a thermistor or a thermocouple can be used as the temperature sensor 26. The temperature sensor 26 is disposed on the substrate 28. Therefore, it results that the temperature sensor 26 detects the temperature of the light source 22 or the heater 25 via the substrate 28. Alternatively, it results that the temperature sensor 26 detects the temperature of the atom cell 21 via the substrate 28 and the pair of connectors 29. It should be noted that the installation position of the temperature sensor 26 is not limited to the above, and can also be, for example, a place on the connectors 29, a place on the heater 25, or a place on an outside surface of the atom cell 21.

Connector (Fixation Member)

As shown in FIG. 3, the pair of connectors 29 are disposed so as to sandwich the atom cell 21, and respectively have contact with the light transmissive parts 212, 213. Further, the pair of connectors 29 are each formed so as to avoid a passing area of the light LL. The connectors 29 shown in FIG. 3 each have a recessed part, into which the atom cell 21 is fitted. Due to the fitting, the atom cell 21 is fixed to the connector 29. Further, to one end surface of the connector 29, there is fixed the substrate 28, on which light source 22 is disposed, with an adhesive or the like. Further, to the other end surface of the connector 29, there is fixed the photodetector 24 with an adhesive or the like. As described above, the relative positional relationship between the atom cell 21, the light source 22, and the photodetector 24 is fixed by the connectors 29. It should be noted that the shape of the pair of connectors 29 is not limited to what is shown in the drawings as long as relative positional relationship between at least the atom cell 21, the light source 22, and the photodetector 24 can be fixed. Further, the pair of connectors 29 can be integrated with each other, or each of the connectors 29 can be constituted by a plurality of members.

As described above, each of the pair of connectors 29 thermally connects the heater 25 and each of the light transmissive parts 212, 213 of the atom cell 21 to each other. Thus, it is possible to transmit the heat from the heater 25 to each of the light transmissive parts 212, 213 due to the heat conduction by the pair of connectors 29 to thereby heat each of the light transmissive parts 212, 213. Further, it is possible to separate the heater 25 and the atom cell 21 from each other. Therefore, an unwanted magnetic field generated by the energization of the heater 25 can be prevented from making a harmful influence to the alkali metal atom in the atom cell 21. Further, since the number of heaters 25 can be decreased, it is possible to, for example, decrease the number of interconnections for energization to the heaters 25, and as a result, miniaturization of the atomic oscillator 1 can be achieved.

Further, in the present embodiment, the surface of each of the pair of connectors 29 located on the opposite side to the atom cell 21 is provided with a recessed part for disposing the coil 27.

As a constituent material of such connectors 29 as described above, it is preferable to use a material superior in thermal conductivity such as a metal material. Further, in order not to hinder the magnetic field from the coil 27, it is preferable to use a nonmagnetic material as the constituent material of the connectors 29.

Coil

The coil 27 is disposed so as to surround the outer side of the pair of connectors 29 around the optical axis a. The coil 27 has a function of applying a magnetic field to the alkali metal located in the atom cell 21. Thus, it is possible to enlarge the degenerate gaps between the energy levels different from each other of the alkali metal atom located in the atom cell 21 using the Zeeman split to thereby improve the resolution. As a result, the accuracy of the oscillation frequency of the atomic oscillator 1 can be improved.

In the present embodiment, the coil 27 is a solenoidal coil disposed so as to be wound around the optical axis a along the outer circumference of the body 211 of the atom cell 21. It should be noted that the coil 27 can also be a Helmholtz coil formed of a pair of coils disposed so as to be opposed to each other in a direction along the optical axis a via the atom cell 21.

Further, the magnetic field generated by the coil 27 can be either one of a direct-current magnetic field and an alternating-current magnetic field, or can also be a magnetic field obtained by superimposing the direct-current magnetic field and the alternating-current magnetic field on each other.

Substrate

The substrate 28 is a substrate superior in thermal conductivity, and on one surface of the substrate 28, there are mounted the light source 22, the heater 25, the temperature sensor 26, and the pair of connectors 29 described above. Here, the pair of connectors 29 are bonded to each other with, for example, an adhesive.

Such a substrate 28 as described above has a function of supporting the light source 22, the heater 25, the temperature sensor 26, the pair of connectors 29, and so on described above. Further, the substrate 28 has a function of transmitting the heat from the heater 25 to the light source 22 and the pair of connectors 29.

Further, the substrate 28 is provided with interconnections (not shown) to be electrically connected to the light source 22, the heater 25, and the temperature sensor 26.

The constituent material of such a substrate 28 is not particularly limited, but there can be cited, for example, a ceramic material and a metal material, and it is possible to use either one of these materials alone, or two or more of these materials in combination. Further, as the constituent material of the substrate 28, it is preferable to use a nonmagnetic material in order not to hinder the magnetic field from the coil 27.

It should be noted that at least a part of the substrate 28 can also be integrally constituted with the connector 29 or the support 4 described later. Further, it can also be said that the substrate 28 constitutes a part of the connectors 29 described above.

Container

As shown in FIG. 2, the container 3 has a function of housing the atom cell unit 2 and the support 4. It should be noted that other components than the components described above can also be housed in the container 3.

As shown in FIG. 2, the container 3 is provided with a base 31 having a plate-like shape and a lid 32 having a bottomed cylindrical shape, and the opening of the lid 32 is closed by the base 31. Thus, there is formed an internal space S1 for housing the atom cell unit 2 and the support 4. Here, the lid 32 is separated from the atom cell unit 2 and the support 4. Thus, it is possible to reduce the thermal interference between the atom cell unit 2 and the lid 32.

The base 31 has a mounting surface 311 (an upper surface) for supporting the atom cell unit 2 via the support 4. The mounting surface 311 is along a plane including the X axis and the Y axis. Further, the base 31 is, for example, a wiring board, and on the lower surface of the base 31, there is disposed a plurality of external terminals 33. The plurality of external terminals 33 is electrically connected to a plurality of internal terminals (not shown) disposed on the upper surface of the base via interconnections not shown.

The constituent material of the base 31 is not particularly limited, but there can be used, for example, a resin material and a ceramics material, and it is preferable to use the ceramics material. Thus, it is possible to make the airtightness of the internal space S1 excellent while realizing the base 31 for constituting the wiring board.

The lid 32 is bonded to such abase 31 described above. The bonding method of the base 31 and the lid 32 is not particularly limited, but there can be used, for example, brazing, seam welding, and energy beam welding (e.g., laser welding and electron beam welding). It should be noted that it is possible for a bonding member for bonding the base 31 and the lid 32 to each other to intervene between the base 31 and the lid 32.

Such an internal space S1 of the container 3 as described above is an airtight space. In particular, the internal space S1 is in a reduced-pressure state (a vacuum state) reduced in pressure from the atmospheric pressure. Thus, the transmission of the heat between the atom cell unit 2 and the container 3 via the internal space S1 can effectively be suppressed. Therefore, it is possible to reduce the temperature variation of the atom cell unit 2 due to the external temperature variation of the container 3, and to reduce the power consumption of the heater 25.

The constituent material of such a lid 32 is not particularly limited, but there can be used, for example, a resin material, a ceramics material, and a metal material, and it is preferable to use the metal material such as Kovar, 42-alloy, or stainless steel. Thus, it is possible to make the airtightness of the internal space S1 excellent while realizing the lid 32 having a magnetic shield property.

Support

The support 4 has a function of supporting the atom cell unit 2 described above with respect to the mounting surface 311 of the base 31 of the container 3. In particular, the support 4 supports the atom cell unit 2 with respect to the mounting surface 311 in a posture in which the atom cell 21, the light source 22, and the photodetector 24 of the atom cell unit 2 are arranged in a direction along the mounting surface 311.

Further, the support 4 has a function of reducing the heat transfer between the atom cell unit 2 and the outside. Thus, it is possible to accurately perform the temperature control of the atom cell 21, the light source 22, and so on.

As shown in FIG. 2, the support 4 has a frame 41, two sheets 42, 43, and legs 44.

As shown in FIG. 3, the frame 41 is disposed so as to surround the periphery of the atom cell unit 2 when viewed from the Z-axis direction. The constituent material of the frame 41 is not particularly limited providing the material is relatively low in thermal conductivity, but nonmetal such as a resin material or a ceramics material is preferably used, and the resin material is more preferably used. In the case of forming the frame 41 mainly using the resin material, it is possible to increase the thermal resistance of the frame 41, and even in the case in which the shape of the frame 41 is complicated, the frame 41 can easily be manufactured using a known method such as injection molding.

As shown in FIG. 2, to the lower surface of such a frame 41, there is bonded the sheet 42, and to the upper surface of the frame 41, there is bonded the sheet 43.

The sheets 42, 43 are each, for example, a flexible wiring board. As shown in FIG. 3, the sheet 42 has a plurality of beams 421 each extending from a part bonded to the frame 41 toward the inside of the frame 41. Similarly, the sheet 43 has a plurality of beams 431 each extending from a part bonded to the frame 41 toward the inside of the frame 41. A tip part of each of the beams 421 is bonded to the lower surface of the atom cell unit 2 described above with an adhesive or the like. Further, a tip part of each of the beams 431 is bonded to the upper surface of the atom cell unit 2 described above with an adhesive or the like.

More specifically, for example, end parts on the atom cell 21 side of the beams 421, 431 located on the −X-axis direction side with respect to the atom cell 21 are bonded to the substrate 28 with an electrically-conductive adhesive. Thus, the substrate 28 is supported by the beams 421, 431 while making it possible to electrically connect the interconnections provided to the beams 421, 431 and the substrate 28 to each other. Further, end parts on the atom cell 21 side of the beams 421, 431 located on the +X-axis direction side with respect to the atom cell 21 are bonded to the photodetector 24 with an electrically-conductive adhesive. Thus, the photodetector 24 is supported by the beams 421, 431 while making it possible to electrically connect the interconnections provided to the beams 421, 431 and the photodetector 24 to each other.

As described above, on the substrate 28, there is mounted the light source 22, and the relative positional relationship between the substrate 28 and the photodetector 24 is fixed by the connectors 29 together with the atom cell 21 and so on. Further, as described later, the plurality of beams 421, 431 is supported by the frame 41 connected to the mounting surface 311 via the plurality of legs 44. Therefore, since the plurality of beams 421, 431 is bonded to the substrate 28 and the photodetector 24, it results that the atom cell 21, the light source 22, the photodetector 24, and so on are supported in a lump with respect to the mounting surface 311. It should be noted that the expression "supported in a lump with respect to the mounting surface 311" will be described later.

Further, according to the sheets 42, 43 described above, since the thermal resistance in the surface direction is high, the thermal conduction between the frame 41 and the atom cell unit 2 can be reduced. In particular, since the frame 41 and the atom cell unit 2 are connected to each other via the plurality of beams 421, 431 narrow in width, it is possible to stably support the atom cell unit 2 with respect to the frame 41, and at the same time effectively reduce the thermal conduction between the frame 41 and the atom cell unit 2.

Further, at least one of the plurality of beams 421 has interconnections (not shown) electrically connected to the light source 22, the photodetector 24, the heater 25, the temperature sensor 26, and the coil 27. The interconnections are electrically connected to the internal terminals (not shown) of the container 3 described above via interconnections not shown.

Further, to the lower end part of the frame 41, there is connected the plurality of legs 44 via the sheet 42. The plurality of legs 44 is fixed to the mounting surface 311 of the base 31 with an adhesive or the like to support the frame 41 with respect to the mounting surface 311. As the constituent material of the plurality of legs 44, materials similar to the constituent material of the frame 41 described above can be used. Further, it is also possible for the plurality of legs 44 to be integrally formed with the frame 41.

The configuration of the package 10 is hereinabove described.

The atomic oscillator 1 as a kind of a quantum interference device describe hereinabove is provided with the base 31 having the mounting surface 311, the atom cell 21 in which the alkali metal atoms are encapsulated, the light source 22 for emitting the light LL for exciting the alkali metal atoms, the photodetector 24 for detecting the light LL having been transmitted through the atom cell 21, and the support 4 for supporting the atom cell 21, the light source 22, and the photodetector 24 in a lump with respect to the mounting surface 311 in the state of being arranged in the direction along the mounting surface 311.

According to such an atomic oscillator 1, since the support 4 supports the atom cell 21, the light source 22, and the photodetector 24 in a lump (integrally) with respect to the mounting surface 311, the atom cell 21, the light source 22, and the photodetector 24 can be housed in a lump in a single small-sized container 3. Moreover, since the atom cell 21, the light source 22, and the photodetector 24 supported by the support 4 are arranged in the direction along the mounting surface 311, even if the necessary distance between the atom cell 21 and the light source 22 is sufficiently ensured, the height reduction of the atomic oscillator 1 can be achieved. Therefore, it is possible to provide the atomic oscillator 1 small in size and capable of achieving the height reduction while making the characteristics (e.g., oscillation characteristics) excellent. It should be noted that the expression "the support 4 supports the atom cell 21, the light source 22, and the photodetector 24 in a lump (integrally) with respect to the mounting surface 311" denotes the state in which the relative positions of the atom cell 21, the light source 22, and the photodetector 24 with respect to the mounting surface 311 are determined by the support 4 while putting the atom cell 21, the light source 22, and the photodetector 24 together (i.e., in a lump), and includes both of the case in which the members supported by the support 4 have contact with the mounting surface 311, and the case in which the members do not have contact with the mounting surface 311.

Here, the distance L1 between an end of the atom cell 21 located on the opposite side to the mounting surface 311 and the mounting surface 311 is shorter than the distance L2 between the light source 22 and the photodetector 24. In other words, the height H, which is a length of the atom cell unit 2 along the Z-axis direction, is shorter than a length L of the atom cell unit 2 along the X-axis direction. Thus, the height reduction of the atomic oscillator 1 can be achieved compared to the case in which the atom cell 21, the light source 22, and the photodetector 24 are arranged along a direction perpendicular to the mounting surface 311.

Further, the atomic oscillator 1 is provided with the container 3 having the internal space S1, which houses the atom cell 21, the light source 22, the photodetector 24, and the support 4, and is reduced in pressure from the atmospheric pressure. Further, the base 31 constitutes a part of the container 3. Thus, it is possible to reduce the thermal conduction between the atom cell unit 2 including the atom cell 21 and the light source 22, and the container 3. Therefore, it is possible to make the oscillation characteristics of the atomic oscillator 1 excellent, and to achieve the reduction in power consumption of the atomic oscillator 1.

Further, the atomic oscillator 1 is provided with the pair of connectors 29, which fix the relative positional relationship between the atom cell 21, the light source 22, and the photodetector 24. Thus, it is possible to reduce the deterioration of the oscillation characteristic due to the displacement of the relative positional relationship between the atom cell 21, the light source 22, and the photodetector 24. Further, since the support 4 is formed using a material low in thermal conductivity than the pair of connectors 29, the thermal conduction between the atom cell 21, the light source 22, and the photodetector 24 and the base 31 via the support 4 can be reduced. Further, due to the high thermal conductivity of the pair of connectors 29, the temperature distribution in the atom cell unit 2 including the atom cell 21 and the light source 22 can be homogenized irrespective of the number and the arrangement of the heaters 25 for heating the atom cell 21 and the light source 22.

Further, since the pair of connector 29 as the connectors are formed using the metal material, the mechanical strength and the thermal conductivity of the pair of connectors 29 can be made excellent.

Further, since the support 4 is formed using the resin material, the thermal resistance of the support 4 can be made higher while ensuring the necessary mechanical strength of the support 4.

Further, the atomic oscillator 1 is provided with the heater 25, which is supported by the support 4 together with the atom cell 21, the light source 22, and the photodetector 24 in a lump, and heats the light source 22. Further, the distance between the heater 25 and the light source 22 is shorter than the distance between the heater 25 and the atom cell 21. Thus, the temperature control of the light source can be performed with high accuracy. Therefore, the wavelength variation of the light LL from the light source 22 due to the temperature variation of the light source 22 can be reduced.

Further, when viewed along the direction (the X-axis direction) in which the atom cell 21 and the light source 22 are arranged, the width W1, which is a length of the atom cell 21 in a direction along the mounting surface 311, is larger than the height H1, which is a length of the atom cell 21 in a direction perpendicular to the mounting surface 311. Thus, the height reduction of the atom cell 21 can be achieved while ensuring the necessary irradiation area of the light LL from the light source 22 to the atom cell 21.

Second Embodiment

Then, a second embodiment of the invention will be described.

Figure 5:
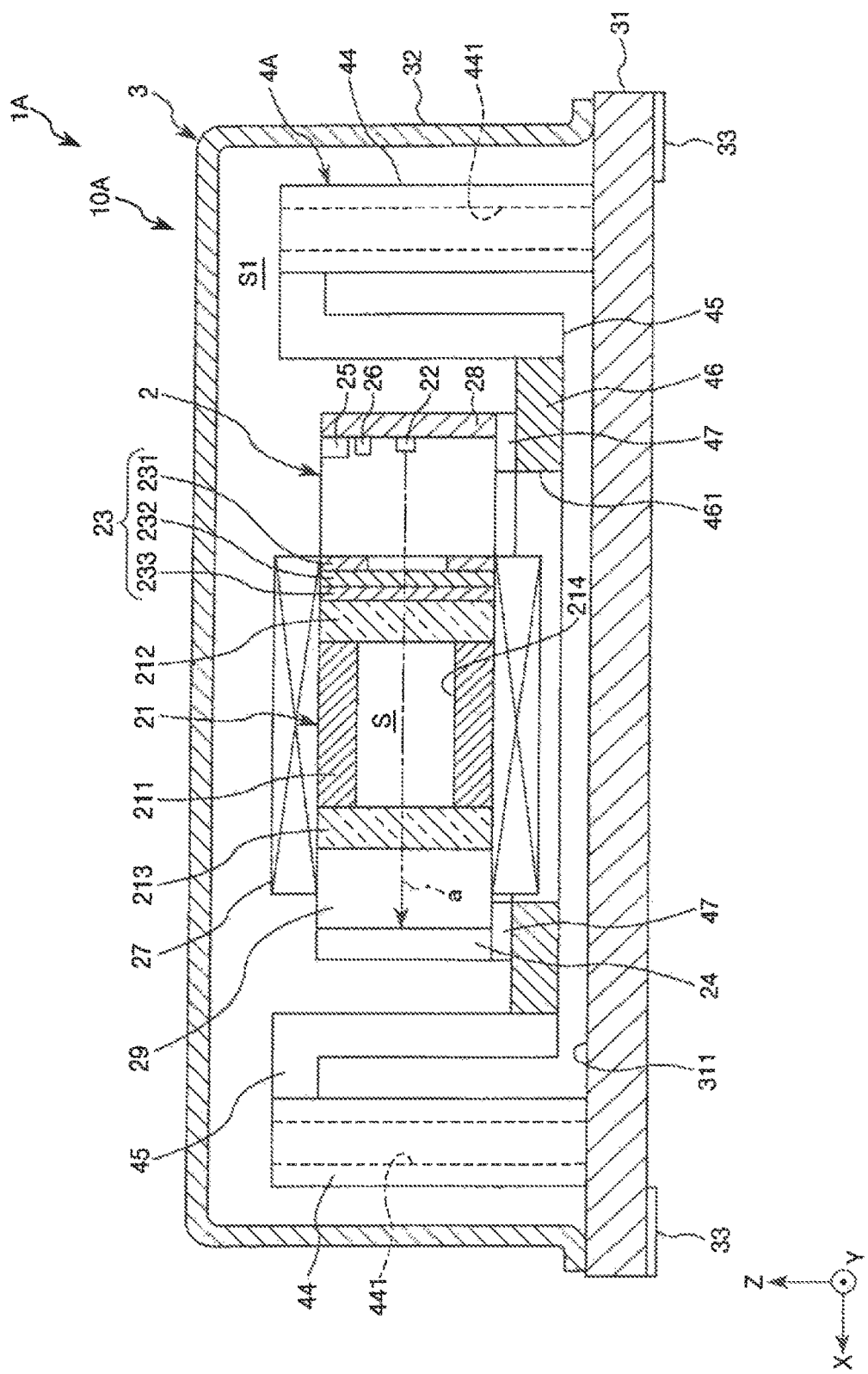
FIG. 5 is a cross-sectional view showing a schematic configuration of a package provided to an atomic oscillator according to second embodiment.
Figure 6:
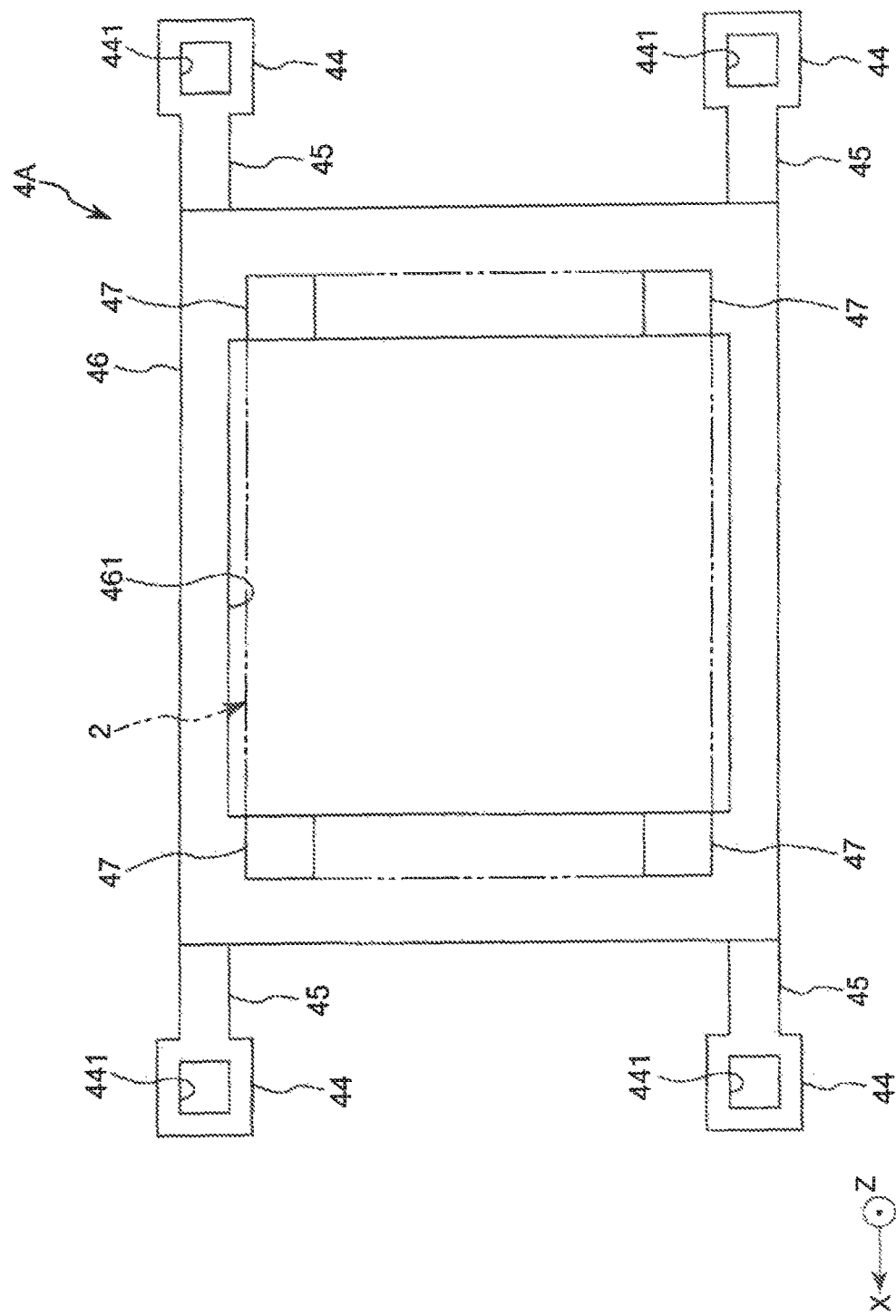
FIG. 6 is a plan view showing a support provided to the package shown in FIG. 5.

FIG. 5 is a cross-sectional view showing a schematic configuration of a package provided to an atomic oscillator according to the second embodiment of the invention. FIG. 6 is a plan view showing a support provided to the package shown in FIG. 5.

The atomic oscillator according to the present embodiment is substantially the same as the first embodiment described above except the point that the configuration of the support is different.

It should be noted that in the description below, the second embodiment will be described with a focus on the difference from the embodiment described above, and the description of substantially the same issues will be omitted. Further, in FIG. 5 and FIG. 6, the constituents substantially identical to those of the embodiment described above are denoted by the same reference symbols.

The package 10A provided to the atomic oscillator 1A shown in FIG. 5 is provided with a support 4A instead of the support 4 in the first embodiment described above.

The support 4A supports the atom cell unit 2 with respect to the mounting surface 311 in a posture in which the atom cell 21, the light source 22, and the photodetector 24 of the atom cell unit 2 are arranged in a direction along the mounting surface 311.

As shown in FIG. 5 and FIG. 6, the support 4A has the plurality of legs 44 erected in the peripheral part of the mounting surface 311 of the base 31, a plate 46 disposed so as to be surrounded by the plurality of legs 44, a plurality of beams 45 for respectively connecting the plurality of legs 44 and the plate 46 to each other, and a plurality of pillars 47 for connecting the plate 46 and the atom cell unit 2 to each other.

The plurality of legs 44 extends along the Z-axis direction. Further, each of the legs 44 has a through hole 441 extending in the Z-axis direction. Thus, the thermal resistance in the length direction of each of the legs 44 can be made higher while making the mechanical strength of each of the legs 44 excellent.

To the upper end part of such a leg 44, there is connected one end part of the beam 45. Each of the beams 45 extends from the leg 44 toward the central part of the container 3, and then extends downward. Further, the other end part of each of the beams 45 is connected to the plate 46. Therefore, the plate 46 is disposed at a position closer to the mounting surface 311 than to the upper end part of each of the legs 44.

In the central part of the plate 46, there is formed a through hole 461 penetrating in the thickness direction. In the through hole 461, a part of the coil 27 is disposed. Thus, the distance between the plate 46 and the atom cell unit 2 can be made shorter while decreasing the contact area between the plate 46 and the atom cell unit 2. As a result, it is possible to achieve height reduction of the structure constituted by the atom cell unit 2 and the support 4A while reducing the heat transferred from the atom cell unit 2 to the support 4A.

Further, on the outer peripheral part of the plate 46, there is disposed the plurality of pillars 47 for connecting the plate 46 and the atom cell unit 2 to each other. Thus, it is possible to decrease the contact area between the support 4A and the atom cell unit 2 to increase the thermal resistance between the support 4A and the atom cell unit 2.

In the support 4A configured as described above, the heat from the atom cell unit 2 passes through the pillar 47, the plate 46, the beam 45, and the leg 44 in this order, and is then transferred to the base 31. Thus, it is possible to elongate the transfer path from the atom cell unit 2 to the base 31 via the support 4A. Therefore, the transmission of the heat between the atom cell unit 2 and the outside of the container 3 can further be reduced.

Further, the constituent material of the support 4A is not particularly limited providing the material is relatively low in thermal conductivity, and the support 4A can ensure the rigidity for supporting the atom cell unit 2, but nonmetal such as a resin material or a ceramics material is preferably used, and the resin material is more preferably used. In the case of forming the support 4A mainly using the resin material, it is possible to increase the thermal resistance of the support 4A, and even in the case in which the shape of the support 4A is complicated, the support 4A can easily be manufactured using a known method such as injection molding. In particular, in the case of forming the support 4A mainly using the resin material, it is possible to easily form the support 4A formed of a foam high in thermal resistance.

According also to the atomic oscillator 1A related to the second embodiment described hereinabove, the height reduction can be achieved while making the oscillation characteristic excellent.

Third Embodiment

Then, a third embodiment of the invention will be described.

Figure 8:
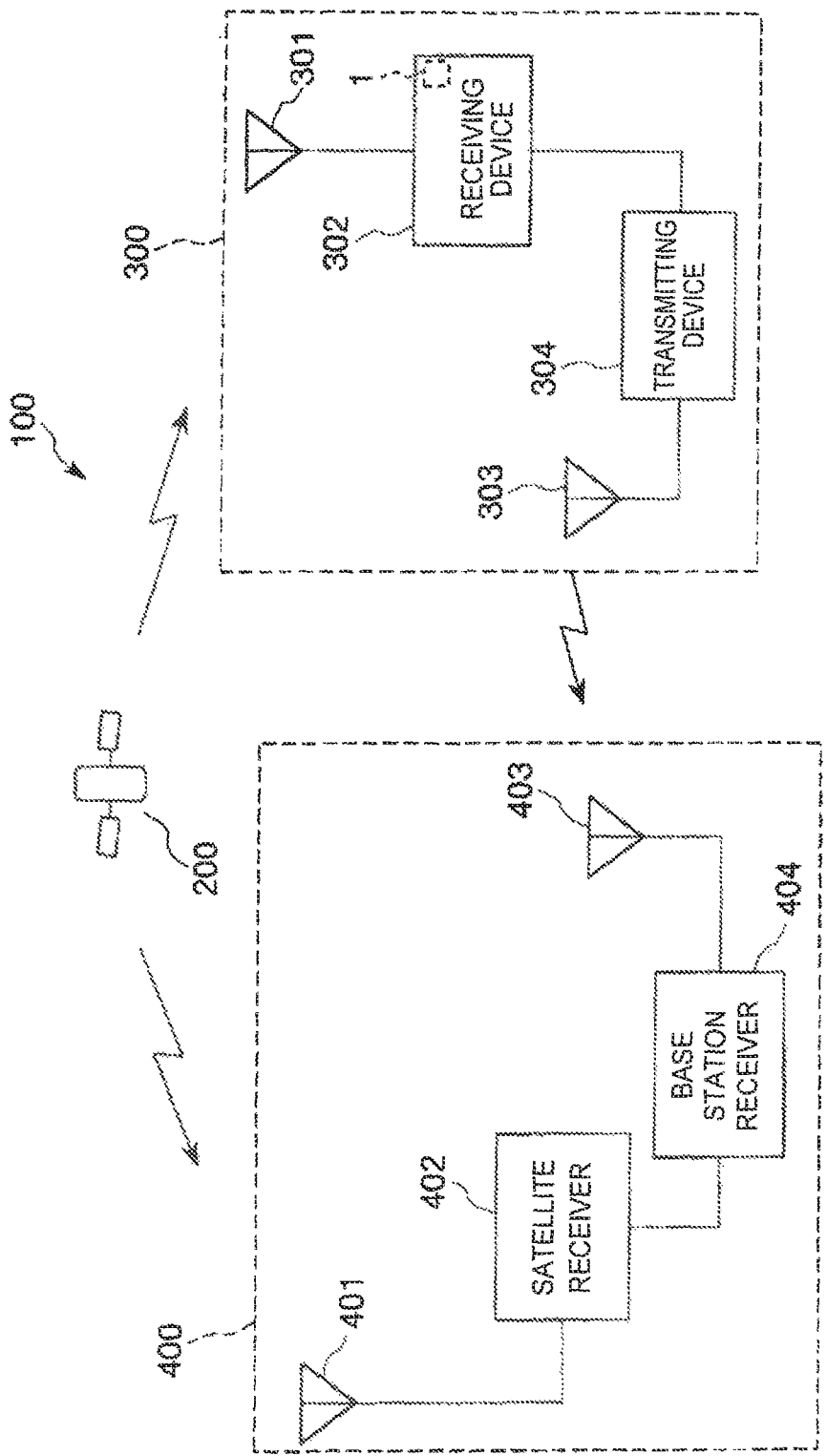
FIG. 8 is a diagram showing a schematic configuration in the case of using the atomic oscillator according to the embodiments in a positioning system using a GPS satellite.

FIG. 8 is a cross-sectional view showing a schematic configuration of a package provided to an atomic oscillator according to the third embodiment of the invention.

The atomic oscillator according to the present embodiment is substantially the same as the first embodiment described above except the point that the arrangement of the coil is different.

It should be noted that in the description below, the third embodiment will be described with a focus on the difference from the embodiments described above, and the description of substantially the same issues will be omitted. Further, in FIG. 7, the constituents substantially identical to those of the embodiments described above are denoted by the same reference symbols.

Figure 7:
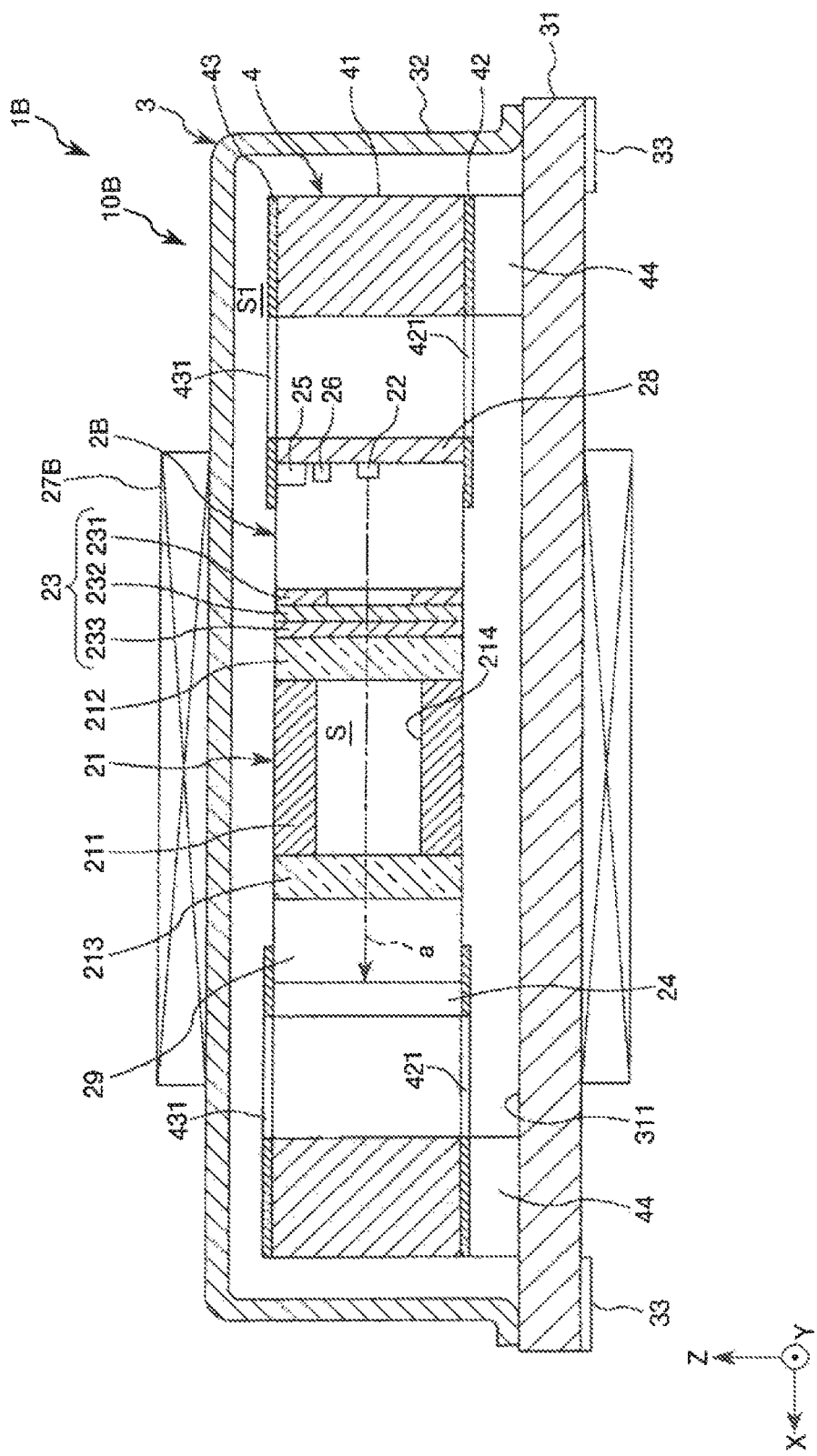
FIG. 7 is a cross-sectional view showing a schematic configuration of a package provided to an atomic oscillator according to third embodiment.

The package 10B provided to the atomic oscillator 1B shown in FIG. 7 is provided with a coil 27B disposed outside the container 3 instead of the coil 27 in the first embodiment described above. Specifically, in the package 10B, the atom cell unit 2B, which has substantially the same configuration as the atom cell unit 2 according to the first embodiment except the point that the coil 27 is eliminated, is housed in the container 3. The atom cell unit 2B can achieve the miniaturization and the height reduction as much as the space formed by eliminating the coil 27. Due to the above, the container 3 can also achieve the miniaturization and the height reduction. Therefore, it is possible to decrease the capacity of the internal space 51 of the container 3, and thus, the degree of vacuum of the internal space S1 can easily be improved.

It should be noted that in the present embodiment, as the constituent material of the base 31 and the lid 32, a non-magnetic material such as SUS304 is used.

According also to the atomic oscillator 1B related to the third embodiment described hereinabove, the height reduction can be achieved while making the oscillation characteristic excellent.

2. Electronic Apparatus

The atomic oscillator (1, 1A, 1B, hereinafter represented by the atomic oscillator 1) according to the invention as described hereinabove can be incorporated in a variety of electronic apparatuses.

An example of the electronic apparatus equipped with the atomic oscillator according to the invention will hereinafter be described.

FIG. 8 is a diagram showing a schematic configuration in the case of using the atomic oscillator according to the invention to a positioning system using a GPS satellite.

The positioning system 100 shown in FIG. 8 is constituted by the GPS satellite 200, a base station device 300, and a GPS receiving device 400.

The GPS satellite 200 transmits positioning information (a GPS signal).

The base station device 300 is provided with a receiving device 302 for accurately receiving the positioning information from the GPS satellite 200 via an antenna 301 installed at, for example, an electronic reference point (a GPS continuous observation station), and a transmitting device 304 for transmitting the positioning information, which has been received by the receiving device 302, via an antenna 303.

Here, the receiving device 302 is an electronic device equipped with the atomic oscillator 1 according to the invention described above as a reference frequency oscillation source for the receiving device 302. Such a receiving device 302 has excellent reliability. Further, the positioning information having been received by the receiving device 302 is transmitted by the transmitting device 304 in real time.

The GPS receiving device 400 is provided with a satellite receiver 402 for receiving the positioning information from the satellite 200 via an antenna 401, and a base station receiver 404 for receiving the positioning information from the base station device 300 via an antenna 403.

Since the receiving device 302 as an example of the electronic apparatus of the positioning system 100 as described above is equipped with the atomic oscillator 1 as a kind of a quantum interference device, it is possible to achieve the height reduction of the atomic oscillator 1 while making the characteristics of the atomic oscillator 1 excellent.

It should be noted that, the electronic apparatus according to the invention is not limited to those described above, and as the electronic apparatus according to the invention, there can be cited, for example, a smartphone, a tablet terminal, a timepiece, a cellular phone, a digital still camera, an inkjet ejection device (e.g., an inkjet printer), a personal computer (a mobile personal computer and a laptop personal computer), a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), a flight simulator, digital terrestrial broadcasting equipment, and a cellular phone base station.

3. Vehicle

Further, the atomic oscillator (1, 1A, 1B, hereinafter represented by the atomic oscillator 1) according to the invention as described above can be incorporated in a variety of vehicles.

Hereinafter, an example of the vehicle according to the invention will hereinafter be described.

Figure 9:
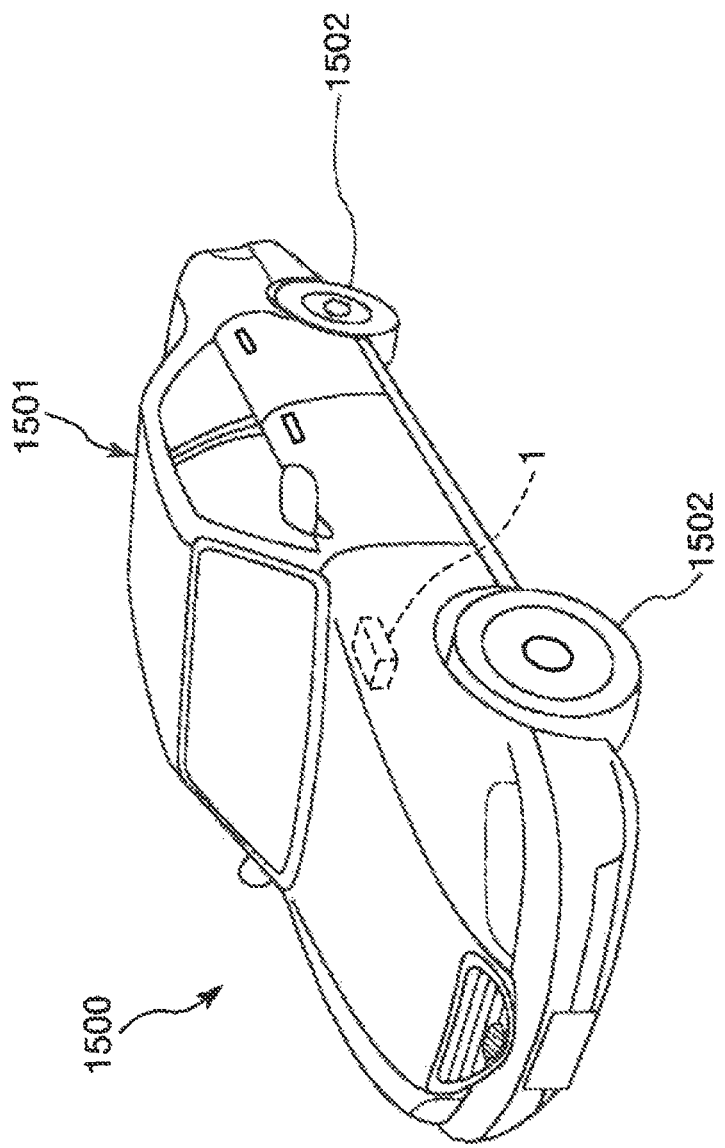
FIG. 9 is a perspective view showing a configuration of a vehicle (a car) equipped with the atomic oscillator according to the embodiments.

FIG. 9 is a perspective view showing a configuration of a vehicle (a car) equipped with the atomic oscillator according to the invention.

The vehicle 1500 shown in FIG. 9 has a vehicle body 1501, and four wheels 1502, and is configured so as to rotate the wheels 1502 by a power source (an engine) not shown provided to the vehicle body 1501. Such a vehicle 1500 incorporates the atomic oscillator 1. Further, a controller not shown, for example, controls the drive of the power source based on the oscillation signal from the atomic oscillator 1.

Since the vehicle 1500 as described above is equipped with the atomic oscillator 1 as a kind of a quantum interference device, it is possible to achieve the height reduction of the atomic oscillator 1 while making the characteristics of the atomic oscillator 1 excellent.

Although the quantum interference device, the atomic oscillator, the electronic apparatus, and the vehicle according to the invention are hereinabove described based on the embodiments shown in the accompanying drawings, the invention is not limited to these embodiments, but the configuration of each of the elements of the embodiments described above can be replaced with one having an arbitrary configuration with an equivalent function, or can also be added with an arbitrary configuration.

What is claimed is:

1. A quantum interference device comprising:
   a base having a mounting surface;
   an atom cell in which alkali metal atoms are encapsulated;
   a light source adapted to emit light adapted to excite the alkali metal atoms;
   a photodetector adapted to detect the light transmitted through the atom cell; and
   a support adapted to support the atom cell, the light source, and the photodetector integrally in a lump with respect to the mounting surface in a state in which the atom cell, the light source, and the photodetector are arranged in a direction along the mounting surface,
   wherein the support comprises a frame which integrally connects the atom cell, photodetector, and light source to each other such that relative positions of the atom cell, the light source, and the photodetector with respect to the mounting surface are determined by the support while putting the atom cell, the light source, and the photodetector together in the lump,
   wherein the support has direct contact with the mounting surface,
   wherein the frame surrounds the atom cell, photodetector, and light source when viewed in a Z direction perpendicular to an X-Y plane defined by the mounting surface, but the frame does not extend in the Z direction above the atom cell, photodetector, and light source, and
   wherein the mounting surface is a supporting surface that is separate from the support such that the lump is separate from the mounting surface and such that the lump rests on the mounting surface.

2. The quantum interference device according to claim 1, further comprising:
   a connector that fixes a relative positional relationship between the atom cell, the light source, and the photodetector,
   wherein the thermal conductivity of the support is lower than the thermal conductivity of the connector.

3. The quantum interference device according to claim 2, wherein
   the connector contains a metal material.

4. The quantum interference device according to claim 2, wherein
   the support contains a resin material.

5. The quantum interference device according to claim 1, further comprising:
   a heater supported by the support together with the atom cell, the light source, and the photodetector in a lump, and adapted to heat the light source,
   wherein a distance between the heater and the light source is shorter than a distance between the heater and the atom cell.

6. The quantum interference device according to claim 1, wherein
   a distance between an end of the atom cell located on an opposite side to the mounting surface and the mounting surface is shorter than a distance between the light source and the photodetector.

7. The quantum interference device according to claim 1, wherein
   a length of the atom cell in a direction in which the atom cell and the light source are arranged and along the mounting surface is longer than a length of the atom cell in a direction perpendicular to the mounting surface.

8. The quantum interference device according to claim 1, further comprising:
   a container that houses the atom cell, the light source, the photodetector, and the support, and the pressure of an internal space of the container is smaller than atmospheric pressure,
   wherein the base constitutes a part of the container.

9. An atomic oscillator comprising:
   the quantum interference device according to claim 1.

10. An electronic apparatus comprising:
    the quantum interference device according to claim 1.

11. A quantum interference device comprising:
    a base having a mounting surface;
    an atom cell in which alkali metal atoms are encapsulated;
    a light source adapted to emit light adapted to excite the alkali metal atoms;
    a photodetector adapted to detect the light transmitted through the atom cell;
    a support adapted to support the atom cell, the light source, and the photodetector integrally in a lump with respect to the mounting surface in a state in which the atom cell, the light source, and the photodetector are arranged in a direction along the mounting surface; and
    a length of the atom cell in a direction in which the atom cell and the light source are arranged and along the mounting surface is longer than a length of the atom cell in a direction perpendicular to the mounting surface, wherein the support contacts the mounting surface that is a supporting surface that is separate from the support such that the lump is separate from the mounting surface and such that the lump rests on the mounting surface, and wherein the support comprises a frame which connects the atom cell, photodetector, and light source to each other, and the frame surrounds the atom cell, photodetector, and light source when viewed in a direction perpendicular to an X-Y plane defined by the mounting surface.

12. The quantum interference device according to claim 11, further comprising:

a connector that fixes a relative positional relationship between the atom cell, the light source, and the photodetector, wherein the thermal conductivity of the support is lower than the thermal conductivity of the connector.

13. The quantum interference device according to claim 12, wherein the connector contains a metal material.

14. The quantum interference device according to claim 12, wherein the support contains a resin material.

15. The quantum interference device according to claim 11, further comprising:

a heater supported by the support together with the atom cell, the light source, and the photodetector in a lump, and adapted to heat the light source, wherein a distance between the heater and the light source is shorter than a distance between the heater and the atom cell.

16. The quantum interference device according to claim 11, wherein a distance between an end of the atom cell located on an opposite side to the mounting surface and the mounting surface is shorter than a distance between the light source and the photodetector.

17. The quantum interference device according to claim 11, further comprising:

a container that houses the atom cell, the light source, the photodetector, and the support, and the pressure of an internal space of the container is smaller than atmospheric pressure, wherein the base constitutes a part of the container.

18. An atomic oscillator comprising:

the quantum interference device according to claim 11.

19. An electronic apparatus comprising:

the quantum interference device according to claim 11.

* * * * *